United States Patent
Kishii et al.

(10) Patent No.: US 8,159,305 B2
(45) Date of Patent: Apr. 17, 2012

(54) AMPLIFYING DEVICE

(75) Inventors: Tatsuya Kishii, Iwata (JP); Hirotoshi Tsuchiya, Fukuroi (JP); Masayoshi Nakamura, Nagaokakyo (JP); Masato Miyazaki, Hamamatsu (JP); Akihisa Himeno, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/807,834

(22) Filed: Sep. 15, 2010

(65) Prior Publication Data

US 2011/0068866 A1 Mar. 24, 2011

(30) Foreign Application Priority Data

Sep. 18, 2009 (JP) .................................. 2009-216336

(51) Int. Cl.
    *H03F 3/04* (2006.01)
(52) U.S. Cl. ...................................... 330/297; 330/285
(58) Field of Classification Search .................. 330/297, 330/285, 296
See application file for complete search history.

(56) References Cited

U.S. PATENT DOCUMENTS

| 5,289,137 | A * | 2/1994 | Nodar et al. | 330/296 |
| 6,487,136 | B2 * | 11/2002 | Hidaka | 365/222 |
| 7,183,857 | B2 * | 2/2007 | Doy et al. | 330/297 |
| 7,609,114 | B2 * | 10/2009 | Hsieh et al. | 330/297 |
| 7,733,178 | B1 * | 6/2010 | Delano et al. | 330/251 |
| 7,808,324 | B1 * | 10/2010 | Woodford et al. | 330/297 |
| 8,068,622 | B2 * | 11/2011 | Melanson et al. | 381/120 |
| 8,072,266 | B1 * | 12/2011 | Hoomes et al. | 330/251 |

FOREIGN PATENT DOCUMENTS

JP 5347519 12/1993

* cited by examiner

*Primary Examiner* — Henry Choe
(74) *Attorney, Agent, or Firm* — Pillsbury Winthrop Shaw Pittman LLP

(57) ABSTRACT

An amplifying device includes a selecting section that selects one of a first power source potential and a second power source potential which are different from each other, a potential generating circuit that generates a third power source potential from the power source potential selected by the selecting section, an amplifier that operates with supply of the first power source potential and the third power source potential, and a controlling circuit that variably controls a target to be selected by the selecting section in accordance with at least one of an amplitude of a signal on an input side of the amplifier, an amplitude of a signal on an output side of the amplifier, and the third power source potential.

5 Claims, 3 Drawing Sheets

FIG. 3

| AMPLITUDE $\alpha_B$ | SELECTING UNIT 20 SELECTED POTENTIAL | AMPLIFIER 14 NEGATIVE POWER SOURCE | AMPLIFIER 14 POSITIVE POWER SOURCE |
|---|---|---|---|
| $\alpha_B \leq \alpha_{TH\_B}(0.5V)$ | $V_1[+](1.8V)$ | $V_3[-]_1(-1.0V)$ | $V_1[+](1.8V)$ |
| $\alpha_B > \alpha_{TH\_B}(0.5V)$ | $V_2[+](3.7V)$ | $V_3[-]_2(-2.0V)$ | $V_1[+](1.8V)$ |

FIG. 4

| NEGATIVE SIDE POWER SOURCE POTENTIAL $V_3[-]$ | SELECTING UNIT 20 SELECTED POTENTIAL | AMPLIFIER 14 NEGATIVE POWER SOURCE | AMPLIFIER 14 POSITIVE POWER SOURCE |
|---|---|---|---|
| $V_3[-] \leq V_{TH}[-]$ | $V_1[+](1.8V)$ | $V_3[-]_1(-1.0V)$ | $V_1[+](1.8V)$ |
| $V_3[-] > V_{TH}[-]$ | $V_2[+](3.7V)$ | $V_3[-]_2(-2.0V)$ | $V_1[+](1.8V)$ |

AMPLIFYING DEVICE

BACKGROUND

The present invention relates to a technology for amplifying an electric signal.

As shown in FIG. 6, there is disclosed in, e.g., JP-A-5-347519, an amplifying device 90 having a charge pump circuit 94 for generating a positive side power source potential VA and a negative side power source potential VB which are supplied to an amplifier 92. The charge pump circuit 94 generates the negative side power source potential VB by reducing the positive side power source potential VA supplied from the outside, and supplies the negative side power source potential VB to the amplifier 92.

However, in the technology of JP-A-5-347519, there is a problem that it is difficult to increase an output amplitude (increase an output) and, at the same time, reduce power consumption. Specifically, when the positive side power source potential VA is reduced in order to reduce the power consumption, the output amplitude is also reduced, while when the positive side power source potential VA is increased in order to increase the output amplitude, the power consumption is also increased.

SUMMARY

In consideration of the above-described circumstances, an object of the present invention is to increase the output amplitude and, at the same time, reduce the power consumption.

In order to achieve the above object, according to the present invention, there is provided an amplifying device, comprising:

a selecting section that selects one of a first power source potential and a second power source potential which are different from each other;

a potential generating circuit that generates a third power source potential from the power source potential selected by the selecting section;

an amplifier that operates with supply of the first power source potential and the third power source potential; and a controlling circuit that variably controls a target to be selected by the selecting section in accordance with at least one of an amplitude of a signal on an input side of the amplifier, an amplitude of a signal on an output side of the amplifier, and the third power source potential.

Preferably, each of the first power source potential and the second power source potential is one of a positive side potential and a negative side potential relative to a reference potential, the third power source potential is the other of the positive side potential and the negative side potential relative to the reference potential, and the first power source potential is positioned between the second power source potential and the reference potential, and the controlling circuit controls the selecting section so that, when the amplitude of the signal on the input side or the output side of the amplifier is not higher than a threshold value, the first power source potential is selected, while when the amplitude of the signal on the input side or the output side of the amplifier is higher than the threshold value, the second power source potential is selected.

Preferably, each of the first power source potential and the second power source potential is one of a positive side potential and a negative side potential relative to a reference potential, the third power source potential is the other of the positive side potential and the negative side potential relative to the reference potential, and the first power source potential is positioned between the second power source potential and the reference potential, and the controlling circuit controls the selecting section so that, when the third power source potential is on a side with the reference potential relative to a threshold value, the second power source potential is selected, while when the third power source potential is on the side opposite to the side with the reference potential relative to the threshold value, the first power source potential is selected.

Preferably, the potential generating circuit has a DC-DC converter or a charge pump circuit.

Preferably, an absolute value of the third power source potential is smaller than an absolute value of the power source potential selected by the selecting section.

BRIEF DESCRIPTION OF THE DRAWINGS

The above objects and advantages of the present invention will become more apparent by describing in detail preferred exemplary embodiments thereof with reference to the accompanying drawings, wherein:

FIG. 3 is a schematic view showing an operation of a controlling circuit;

FIG. 4 is a schematic view showing an operation of a controlling circuit in a second embodiment;

DETAILED DESCRIPTION OF EXEMPLARY EMBODIMENTS

<A: First Embodiment>

Figure 1:
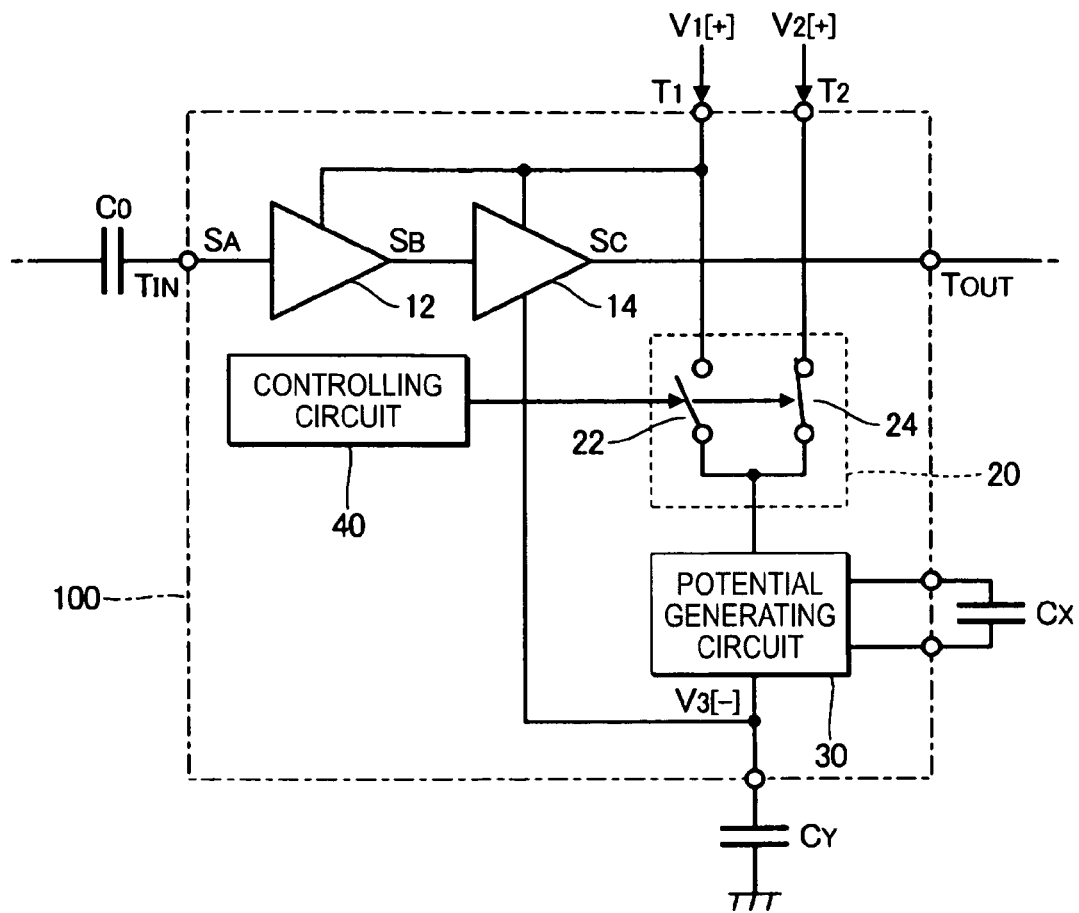
FIG. 1 is a block diagram of an amplifying device according to a first embodiment.

FIG. 1 is a circuit diagram of an amplifying device 100 according to a first embodiment of the present invention. An input signal SA of which a direct current component is removed in a capacitor C0 is supplied to an input terminal TIN of the amplifying device 100. The amplifying device 100 generates an output signal SC obtained by amplifying the input signal SA, and outputs the output signal SC to a load from an output terminal TOUT. For example, the amplifying device 100 is suitably used as a headphone amplifier which generates the output signal SC by amplifying the input signal SA representing an acoustic waveform, and outputs the output signal SC to a sound emitting device (headphones or a speaker) from the output terminal TOUT. The amplifying device 100 is typically formed into a single integrated circuit (chip). However, a structure is also adopted in which the individual elements of the amplifying device 100 are implemented separately in a plurality of integrated circuits.

Figure 2:
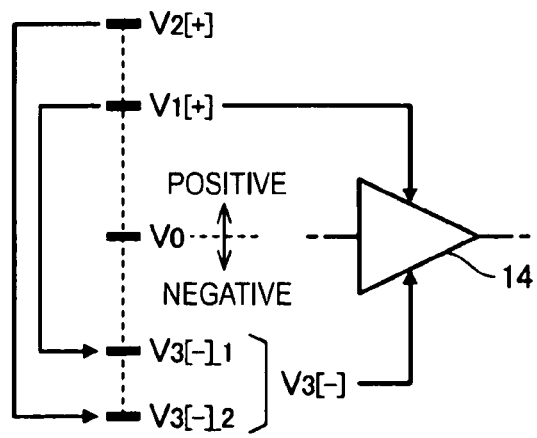
FIG. 2 is a schematic view showing high and low levels of a power source potential.

As shown in FIG. 1, a positive side power source potential V1[+] and a positive side power source potential V2[+] which are different from each other are supplied to the amplifying device 100 from the outside. As shown in FIG. 2, the positive side power source potential V2[+] is a constant potential (e.g., 3.7 V) on a positive side relative to a given reference potential V0 (0 V), and is supplied to a power source terminal T2 of the amplifying device 100 from, e.g., a battery (not shown). On the other hand, the positive side power source potential V1[+] is a constant potential (e.g., 1.8 V) which is lower than the positive side power source potential V2[+] in a range of the positive side relative to the reference potential V0, and is generated, e.g., from the positive side power source potential V2[+] in an external switching regulator (not shown) and supplied to a power source terminal T1 of the amplifying device 100.

As shown in FIG. 1, the amplifying device 100 includes an amplifier 12, an amplifier 14, a selecting unit 20, a potential generating circuit 30, and a controlling circuit 40. The amplifier 12 is a preamplifier which operates by using the positive side power source potential V1[+] as the power source, and generates an intermediate signal SB by amplifying the input signal SA. The amplifier 14 is a main amplifier which operates by using the positive side power source potential V1[+] and a negative side power source potential V3[−] (described later in greater detail) as the power source, and generates the output signal SC by amplifying the intermediate signal SB outputted by the amplifier 12. It is to be noted that the amplifier 12 may be omitted.

The selecting unit 20 selects one of the positive side power source potential V1[+] at the power source terminal T1 and the positive side power source potential V2[+] at the power source terminal T2. The potential (V1[+], V2[+]) selected by the selecting unit 20 is supplied to the potential generating circuit 30. As shown in FIG. 1, the selecting unit 20 is composed of switches 22 and 24 which operate complementarily. Specifically, when one of the switches 22 and 24 is brought into an on state, the other is brought into an off state.

The potential generating circuit 30 is a DC-DC converter which generates the negative side power source potential V3[−] from the potential (V1[+], V2[+]) selected by the selecting unit 30. Specifically, a charge pump circuit which generates the negative side power source potential V3[−] by utilizing capacitors CX and CY is suitably used as the potential generating circuit 30. As shown in FIG. 2, the negative side power source potential V3[−] is a potential on a negative side relative to the reference potential V0 (0 V). The positive side power source potential V1[+] supplied to the power source terminal T1 and the negative side power source potential V3[−] generated by the potential generating circuit 30 are supplied to the amplifier 14. Consequently, the potential of the output signal SC outputted by the amplifier 14 fluctuates toward the positive and negative sides relative to the reference potential V0.

The negative side power source potential V3[−] generated by the potential generating circuit 30 changes in accordance with the potential selected by the selecting unit 20. Specifically, as shown in FIG. 2, when the selecting unit 20 selects the positive side power source potential V1[+], a potential V3[−]_1 (e.g., −1.0 V) is supplied to the amplifier 14 as the negative side power source potential V3[−], while when the selecting unit 20 selects the positive side power source potential V2[+], a potential V3[−]_2 (e.g., −2.0 V) which is lower than the potential V3[−]_1 is supplied to the amplifier 14 as the negative side power source potential V3[−].

The controlling circuit 40 of FIG. 1 variably controls a target to be selected by the selecting unit 20 (which one of the positive side power source potential V1[+] and the positive side power source potential V2[+] is selected) in accordance with an amplitude $\alpha B$ of the intermediate signal SB supplied to the amplifier 14. The amplitude $\alpha B$ denotes an (peak to peak) amplitude corresponding to the difference between the maximum value and the minimum value of the potential of the intermediate signal SB.

Specifically, the controlling circuit 40 compares the amplitude $\alpha B$ of the intermediate signal SB with a given threshold value $\alpha TH\_B$ (e.g., 0.5 V). As shown in FIG. 3, when the amplitude $\alpha B$ is not higher than the threshold value $\alpha TH\_B$ (i.e., when the amplitude of the output signal SC to be generated by the amplifier 14 is small), the controlling circuit 40 controls the selecting unit 20 such that the positive side power source potential V1[+] is selected. Consequently, the positive side power source potential V1[+] and the negative side power source potential V3[−]_1 are supplied to the amplifier 14. On the other hand, when the amplitude $\alpha B$ is higher than the threshold value $\alpha TH\_B$ (i.e., when the amplitude of the output signal SC to be generated by the amplifier 14 is large), the controlling circuit 40 controls the selecting unit 20 such that the positive side power source potential V2[+] is selected. Consequently, as shown in FIG. 3, the positive side power source potential V1[+] and the negative side power source potential V3[−]_2 are supplied to the amplifier 14.

As described above, in the present embodiment, the negative side power source potential V3[−] is variably controlled in accordance with the amplitude $\alpha B$ of the intermediate signal SB. Consequently, when compared with a structure in which only one of the positive side power source potential V1[+] and the positive side power source potential V2[+] is invariably supplied to the potential generating circuit 30 irrespective of the magnitude of the amplitude $\alpha B$, there is an advantage that it is possible to easily reduce power consumption and, at the same time, increase an output amplitude, as will be described hereinbelow in greater detail.

Firstly, when the amplitude $\alpha B$ is small ($\alpha B \leq \alpha TH\_B$), since the negative side power source potential V3[−] is set to the potential V3[−]_1 with the supply of the positive side power source potential V1[+] to the potential generating circuit 30, the potential difference between the positive side power source potential V1[+] and the negative side power source potential V3[−] is reduced when compared with a case where the positive side power source potential V2[+] is supplied to the potential generating circuit 30. Consequently, when compared with the structure in which the positive side power source potential V2[+] is invariably supplied to the potential generating circuit 30 irrespective of the amplitude $\alpha B$ (the structure in which the negative side power source potential V3[−] is fixed to the potential V3[−]_2), the power consumption of the amplifier 14 is reduced. It is to be noted that the maximum amplitude of the output signal SC is reduced due to the reduction in the potential difference between the positive side power source potential V1[+] and the negative side power source potential V3[−], but a limitation (clip) on the potential of the output signal SC does not occur as long as the amplitude $\alpha B$ of the intermediate signal SB is small.

On the other hand, when the amplitude $\alpha B$ is large ($\alpha B > \alpha TH\_B$), since the negative side power source potential V3[−] is set to the potential V3[−]_2 with the supply of the positive side power source potential V2[+] to the potential generating circuit 30, when compared with a case where the positive side power source potential V1[+] is supplied to the potential generating circuit 30, the potential difference between the positive side power source potential V1[+] and the negative side power source potential V3[−] is increased. Consequently, when compared with a case where the positive side power source potential V1[+] is invariably supplied to the potential generating circuit 30 irrespective of the amplitude $\alpha B$ (the structure in which the negative side power source potential V3[−] is fixed to the potential V3_1), the maximum amplitude of the output signal SC is increased. As described above, according to the present embodiment, it is possible to reduce the power consumption and, at the same time, increase the output amplitude.

<B: Second Embodiment>

Next, a description will be given of a second embodiment of the present invention. In each exemplification shown below, as for elements having operations and functions which are equal to those in the first embodiment, the detailed description thereof will be appropriately omitted by labeling the same reference numerals.

When the positive side power source potential V1[+] is supplied to the potential generating circuit 30, in a case where an excessively large current is caused to flow to the load (e.g., the headphones) driven by the amplifying device 100, the negative side power source potential V3[−] supplied to the amplifier 14 may fluctuate in accordance with the current amount. Specifically, as the current supplied to the load is increased (i.e., as the amplitude of the output signal SC is increased), the negative side power source potential V3[−] becomes closer to the reference potential V0. In consideration of the tendency described above, the controlling circuit 40 of the second embodiment variably controls the target (V1[+], V2[+]) to be selected by the selecting unit 20 in accordance with the negative side power source potential V3[−] generated by the potential generating circuit 30.

Specifically, the controlling circuit 40 compares the negative side power source potential V3[−] generated by the potential generating circuit 30 with a threshold value VTH[−]. The threshold value VTH[−] is set to a potential (a negative potential) lower than the reference potential V0. When the current amount supplied to the load is insufficient, the negative side power source potential V3[−] is higher than the threshold value VTH[−] (i.e., the negative side power source potential V3[−] is on the side with the reference potential V0 relative to the threshold value VTH[−]). Consequently, as shown in FIG. 4, when the negative side power source potential V3[−] is higher than the threshold value VTH[−] (V3[−]>VTH[−]), the controlling circuit 40 controls the selecting unit 20 such that the positive side power source potential V2[+] is selected. Specifically, the negative side power source potential V3[−] supplied to the amplifier 14 is set to the potential V3[−]_2 on a low potential side, and the maximum amplitude of the output signal SC is increased (i.e., the current amount supplied to the load is secured).

On the other hand, when the sufficient current amount is supplied to the load, the negative side power source potential V3[−] is not higher than the threshold value VTH[−] (i.e., the negative side power source potential V3[−] is on the side opposite to the side with the reference potential V0 relative to the threshold value VTH[−]). Consequently, as shown in FIG. 4, when the negative side power source potential V3[−] is not higher than the threshold value VTH[−] (V3[−]≦VTH[−]), the controlling circuit 40 controls the selecting unit 20 such that the positive side power source potential V1[+] is selected. Specifically, the negative side power source potential V3[−] supplied to the amplifier 14 is set to the potential V3[−]_1 on a high potential side (i.e., the potential difference between the positive side power source potential V1[+] and the negative side power source potential V3[−] is reduced), and the power consumption in the amplifier 14 is reduced.

As described above, also in the present embodiment, similarly to the first embodiment, when compared with the structure in which only one of the positive side power source potential V1[+] and the positive side power source potential V2[+] is invariably supplied to the potential generating circuit 30, it is possible to easily reduce the power consumption and, at the same time, increase the output amplitude.

<C: Modifications>

Each of the embodiments exemplified above is modified in various manners. Specific modifications are exemplified below. A plurality of modifications exemplified below may be combined appropriately.

(1) Modification 1

The target to be monitored by the controlling circuit 40 in order to control the selecting unit 20 is not limited to the amplitude αB of the intermediate signal SB in the first embodiment or the negative side power source potential V3[−] in the second embodiment. For example, a structure is also adopted in which the selecting unit 20 is controlled in accordance with an (peak to peak) amplitude αA of the input signal SA supplied to the amplifier 12. Specifically, the controlling circuit 40 controls the selecting unit 20 such that, when the amplitude αA of the input signal SA is not higher than a given threshold value αTH_A, the positive side power source potential V1[+] is selected, while when the amplitude αA is higher than the threshold value αTH_A, the positive side power source potential V2[+] is selected. The controlling circuit 40, which controls the selecting unit 20 in accordance with the amplitude αA of the input signal SA or the amplitude αB of the intermediate signal SB, is included as an element which controls the target to be selected by the selecting unit 20 in accordance with the amplitude (e.g., the amplitude αA or the amplitude αB) of the signal on the input side of the amplifier 14 (an arbitrary signal between the source for generating the signal and the input terminal of the amplifier 14).

In addition, a structure is also adopted in which the selecting unit 20 is controlled in accordance with an (peak to peak) amplitude αC of the output signal SC after the amplification by the amplifier 14. Specifically, the controlling circuit 40 controls the selecting unit 20 such that, when the amplitude αC is not higher than a given threshold value αTH_C, the positive side power source potential V1[+] is selected, while when the amplitude αC is higher than the threshold value αTH_C, the positive side power source potential V2[+] is selected. The controlling circuit 40 in the above-described structure is included as an element which controls the target to be selected by the selecting unit 20 in accordance with the amplitude (e.g., the amplitude αC) of the signal on the output side of the amplifier 14 (an arbitrary signal between the output end of the amplifier 14 and the load).

A structure is also adopted in which a plurality of targets exemplified above are monitored by the controlling circuit 40. For example, a structure is also preferable in which the controlling circuit 40 controls the selecting unit 20 on the basis of both of the amplitude αB of the intermediate signal SB (or the amplitude αA of the input signal SA, or the amplitude αC of the output signal SC) and the negative side power source potential V3[−]. As seen from the above description, the controlling circuit 40 is included as an element which controls the selecting unit 20 in accordance with at least one of the amplitude of the signal on the input side of the amplifier 14 (e.g., the amplitude αA of the input signal SA or the amplitude αB of the intermediate signal SB), the amplitude of the signal on the output side of the amplifier 14 (e.g., the amplitude αC of the output signal SC), and the negative side power source potential V3[−] generated by the potential generating circuit 30.

(2) Modification 2

Figure 5:
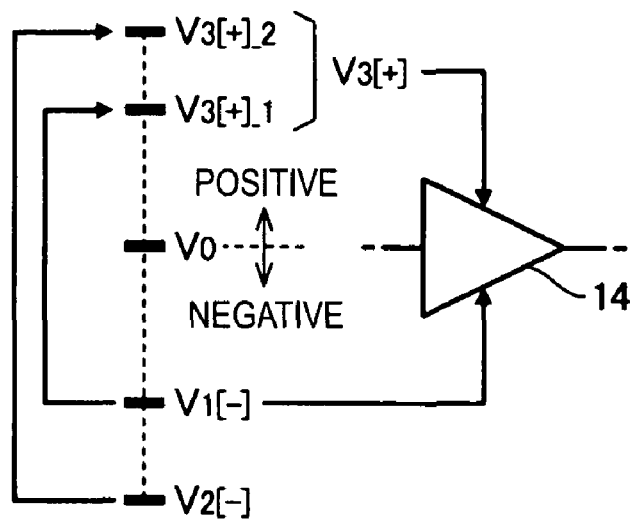
FIG. 5 is a schematic view showing high and low levels of the power source potential in a modification.
Figure 6:
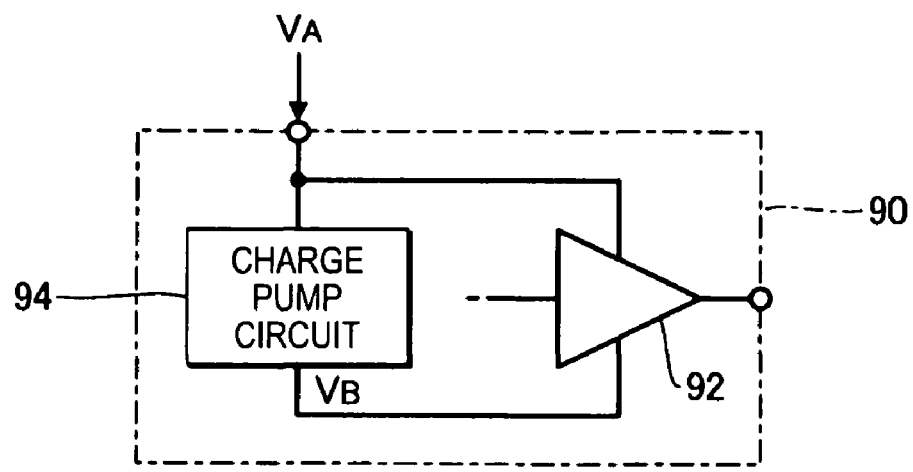
FIG. 6 is a block diagram of a related amplifying device.

A structure may also be adopted in which the polarity of each potential in each of the embodiments described above is reversed. For example, in each of the embodiments described above, the negative side power source potential (V3[−]) is generated from the positive side power source potentials (V1[+], V2[+]). However, as shown in FIG. 5, a structure is also adopted in which the potential generating circuit 30 generates the positive side power source potential (a positive side power source potential V3[+]) from the power source potentials (a negative side power source potential V1[−] and a negative side power source potential V2[−]) on the negative side relative to the reference potential V0. The selecting unit 20 selects one of the negative side power source potential V1[−] and the negative side power source potential V2[−], and supplies the selected potential to the potential generating circuit 30. The amplifier 14 operates by using the negative side power source potential V1[−] supplied to the power source terminal T1 and the positive side power source potential V3[+] generated by the potential generating circuit 30 as the power source.

In the modification obtained by modifying the first embodiment, the controlling circuit 40 causes the selecting unit 20 to select one of the negative side power source potential V1[−] and the negative side power source potential V2[−] in accordance with the amplitude αB of the intermediate signal SB. Specifically, when the amplitude αB of the intermediate signal SB is not higher than the threshold value αTH_B, the controlling circuit 40 controls the selecting unit 20 such that the negative side power source potential V1[−] is selected, and sets the positive side power source potential V3[+] supplied to the amplifier 14 to a potential V3[+]_1 on the low potential side. On the other hand, when the amplitude αB of the intermediate signal SB is higher than the threshold value αTH_B, the controlling circuit 40 controls the selecting unit 20 such that the negative side power source potential V2[−] is selected. Consequently, the positive side power source potential V3[+] supplied to the amplifier 14 is set to a potential V3[+]_2 which is higher than the potential V3[+]_1. Also in the above-described structure, similarly to the first embodiment, both of the reduction in power consumption and the increase in output amplitude are achieved.

In addition, in the modification obtained by modifying the second embodiment, the controlling circuit 40 causes the selecting unit 20 to select one of the negative side power source potential V1 [−] and the negative side power source potential V2[−] in accordance with the positive side power source potential V3[+] generated by the potential generating circuit 30. Specifically, the controlling circuit 40 compares a threshold value VTH[+] and the positive side power source potential V3[+] which are higher than the reference potential V0. When the positive side power source potential V3[+] is on the side with the reference potential V0 relative to the threshold value VTH[+] (i.e., when the current amount supplied to the load is insufficient), the controlling circuit 40 controls the selecting unit 20 such that the negative side power source potential V2[−] is selected, and sets the positive side power source potential V3[+] supplied to the amplifier 14 to the potential V3[+]_2 on the high potential side. On the other hand, when the positive side power source potential V3[+] is on the side opposite to the side with the reference potential V0 relative to the threshold value VTH[+] (i.e., when the sufficient current amount is supplied to the load), the controlling circuit 40 controls the selecting unit 20 such that the negative side power source potential V1[−] is selected, and sets the positive side power source potential V3[+] supplied to the amplifier 14 to the potential V3[+]_1 on the low potential side. Also in the above-described structure, similarly to the second embodiment, both of the reduction in power consumption and the increase in output amplitude are achieved. It is to be noted that the target to be monitored by the controlling circuit 40 in Modification 2 may be appropriately changed as described above in Modification 1.

Here, the embodiments and the modifications are summarized as follows.

An amplifying device of the present invention includes a selecting section for selecting one of a first power source potential (e.g., power source potentials V1[±] of FIGS. 2 and 5) and a second power source potential (e.g., power source potentials V2[±] of FIGS. 2 and 5) which are different from each other, a potential generating circuit which generates a third power source potential (e.g., power source potentials V3[±] of FIGS. 2 and 5) from the power source potential selected by the selecting section, an amplifier which operates with supply of the first power source potential and the third power source potential, and a controlling circuit which variably controls a target to be selected by the selecting section in accordance with at least one of an amplitude of a signal on an input side of the amplifier, the amplitude of the signal on an output side of the amplifier, and the third power source potential.

By the above configuration, the power source potential (one of the first power source potential and the second power source potential) used by the potential generating circuit in order to generate the third power source potential is variably controlled in accordance with the amplitude of the signal on the input side or the output side of the amplifier and the third power source potential. Consequently, it is possible to reduce power consumption and, at the same time, increase an output amplitude. It is to be noted that "the signal on the input side of the amplifier" means an arbitrary signal between a source for generating an input signal to the amplifier or a signal serving as a base for the input signal and an input end of the amplifier, and the concept thereof includes, e.g., an input signal SA and an intermediate signal SB in FIG. 1. In addition, "the signal on the output side of the amplifier" means an arbitrary signal between an output end of the amplifier and a load (an element driven by an output signal of the amplifier), and the concept thereof includes, e.g., an output signal SC in FIG. 1.

In a preferred aspect of the present invention, each of the first power source potential and the second power source potential is one of a positive side potential and a negative side potential relative to a reference potential, the third power source potential is the other of the positive side potential and the negative side potential relative to the reference potential, and the first power source potential is the potential between the second power source potential and the reference potential. In the relationship among the potentials described above, the controlling circuit in a first aspect controls the selecting section such that, when the amplitude of the signal on the input side or the output side of the amplifier is not higher than a threshold value, the first power source potential is selected, while when the amplitude of the signal on the input side or the output side of the amplifier is higher than the threshold value, the second power source potential is selected. Further, the controlling circuit in a second aspect controls the selecting section such that, when the third power source potential is on a side with the reference potential relative to a threshold value, the second power source potential is selected, while when the third power source potential is on the side opposite to the side with the reference potential relative to the threshold value, the first power source potential is selected.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-216336 filed on Sep. 18, 2009, the contents of which are incorporated herein for reference.

What is claimed is:

1. An amplifying device, comprising:
a selecting section that selects one of a first power source potential and a second power source potential which are different from each other;

a potential generating circuit that generates a third power source potential from the power source potential selected by the selecting section;

an amplifier that operates with supply of the first power source potential and the third power source potential; and a controlling circuit that variably controls a target to be selected by the selecting section in accordance with at least one of an amplitude of a signal on an input side of the amplifier, an amplitude of a signal on an output side of the amplifier, and the third power source potential.

2. The amplifying device according to claim 1, wherein each of the first power source potential and the second power source potential is one of a positive side potential and a negative side potential relative to a reference potential, the third power source potential is the other of the positive side potential and the negative side potential relative to the reference potential, and the first power source potential is positioned between the second power source potential and the reference potential; and wherein the controlling circuit controls the selecting section so that, when the amplitude of the signal on the input side or the output side of the amplifier is not higher than a threshold value, the first power source potential is selected, while when the amplitude of the signal on the input side or the output side of the amplifier is higher than the threshold value, the second power source potential is selected.

3. The amplifying device according to claim 1, wherein each of the first power source potential and the second power source potential is one of a positive side potential and a negative side potential relative to a reference potential, the third power source potential is the other of the positive side potential and the negative side potential relative to the reference potential, and the first power source potential is positioned between the second power source potential and the reference potential; and wherein the controlling circuit controls the selecting section so that, when the third power source potential is on a side with the reference potential relative to a threshold value, the second power source potential is selected, while when the third power source potential is on the side opposite to the side with the reference potential relative to the threshold value, the first power source potential is selected.

4. The amplifying device according to claim 1, wherein the potential generating circuit has a DC-DC converter or a charge pump circuit.

5. The amplifying device according to claim 1, wherein an absolute value of the third power source potential is smaller than an absolute value of the power source potential selected by the selecting section.

\* \* \* \* \*